(12) United States Patent
Hoover

(10) Patent No.: US 7,688,147 B1
(45) Date of Patent: Mar. 30, 2010

(54) FLOATING DIFFERENTIAL AMPLIFIER ARCHITECTURES

(76) Inventor: D. Robert Hoover, P.O. Box 724, Ferndale, WA (US) 98248

( * ) Notice: Subject to any disclaimer, the term of this patent is extended or adjusted under 35 U.S.C. 154(b) by 0 days.

(21) Appl. No.: 12/268,349

(22) Filed: Nov. 10, 2008

Related U.S. Application Data

(60) Continuation-in-part of application No. 12/111,056, filed on Apr. 28, 2008, now Pat. No. 7,449,946, which is a division of application No. 11/325,884, filed on Jan. 4, 2006, now Pat. No. 7,365,605.

(60) Provisional application No. 60/641,724, filed on Jan. 5, 2005.

(51) Int. Cl.
*H03F 3/04* (2006.01)
(52) U.S. Cl. ........................ 330/301; 330/258
(58) Field of Classification Search ................. 330/301, 330/252, 258, 124 R, 295
See application file for complete search history.

(56) References Cited

U.S. PATENT DOCUMENTS

| | | | |
|---|---|---|---|
| 7,389,087 B2 * | 6/2008 | Darabi et al. ................. 455/20 |
| 7,504,886 B2 * | 3/2009 | Kataria ........................ 330/289 |
| 7,619,472 B1 * | 11/2009 | Tekin et al. .................. 330/252 |
| 2009/0096533 A1 * | 4/2009 | Paul et al. .................... 330/305 |

* cited by examiner

Primary Examiner—Henry K Choe
(74) Attorney, Agent, or Firm—Kevin Roe

(57) ABSTRACT

A method and system to use floating differential output amplifiers wired in series and parallel to achieve arbitrary output drive voltage and current for the applications load. One embodiment includes the use of multiple differential amplifiers wired in series to generate a high voltage differential amplifier, while only partially using no-feedback buffer amplifiers and obtaining performance equivalent to an implementation that uses only buffer amplifiers. This is achieved by forcing the mismatch errors of conventional amplifiers to become power supply ripple. A second embodiment includes the use of a power supply centering technique to implement a floating asymmetrical differential amplifier. A third embodiment includes the use of multiple floating differential amplifiers, sharing a common power supply with individual biasing and isolation of each section of the amplifier, to allow high power amplifiers to be built with an arbitrary number of low power modules.

20 Claims, 12 Drawing Sheets

US 7,688,147 B1

FLOATING DIFFERENTIAL AMPLIFIER ARCHITECTURES

CROSS-REFERENCE TO RELATED APPLICATIONS

This application is a continuation-in-part of a co-pending U.S. utility patent application Ser. No. 12/111,056, filed Apr. 28, 2008, by the same inventor, entitled "High Voltage, High Current, and High Accuracy Amplifier," to be issued as U.S. Pat. No. 7,449,946 on Nov. 11, 2008, which was a division of the U.S. utility patent application Ser. No. 11/325,884, filed Jan. 4, 2006, entitled "High Voltage, High Current, and High Accuracy Amplifier," issued as U.S. Pat. No. 7,365,605 on Apr. 29, 2008, which claimed priority from a U.S. provisional patent application Ser. No. 60/641,724, filed Jan. 5, 2005, by the same inventor, entitled "High Voltage, High Current, High Accuracy Solid State Audio Amplifier With Adaptive Performance Enhancement," which are all hereby incorporated by reference.

BACKGROUND OF THE INVENTION

1. Field of the Invention

This invention relates to amplifier circuits, and in particular, to providing a lower distortion amplifier capable of creating high voltages to drive highly capacitive loads by using a plurality of floating differential amplifiers.

2. Description of the Prior Art

With the development of high performance audio formats like SACD and DVD-Audio, new demands are being placed on audio reproduction equipment. Electrostatic speakers provide the highest performance achievable to date. Most electrostatic speakers use conventional low voltage power amplifiers and step-up transformers to produce the thousands of volts necessary to drive electrostatic transducers. These output transformers limit the signal fidelity of what is achievable with electrostatic speakers.

Such a design needs to handle the difficult capacitive loading, yet provide extremely low distortion. Traditional high negative feedback amplifier designs have a very difficult time producing highly damped, low distortion signals at high currents while maintaining feedback control, in many applications. Large amounts of negative feedback have traditionally been used to control the varying current needs for the capacitance loading. Capacitive loading also increases the power handling demands on the amplifier at high frequencies.

The high fidelity requirements of such applications mandate that the level of distortion at all frequencies be imperceptibly small. At higher frequencies the dynamics of the music must be maintained while driving high current capacitive loads. At lower frequencies the current requirements are thousands of times smaller because of the higher impedances. With these extremes occurring simultaneously, the reproduced dynamics are much higher than just what is provided by the input signal. As a result, the amplifier must have much lower distortion than traditional high performance amplifiers, while handling extremely high impulse and high frequency currents cleanly. Therefore, the dynamic range and feedback systems of amplifiers for such applications need to be many times better than those designed for a traditional amplifier driving an almost pure resistive load.

One common characteristic of many high negative feedback amplifiers is that the distortion effectively increases, as the signal level gets lower. This is counter to the needs of an amplifier with dynamic range requirements of high capacitive loading. This phenomenon is the result of several processes. One process is the continual "hunting" that is inherent in these designs. The constant correction of the feedback circuit induces extra output noise into the output signal. This "hunting" signature of the output noise hides many of the subtle details of the input signal (e.g., the music signal, or an equivalent amplifier input signal). In audio amplifier applications, this output noise can mask the low and mid frequency music detail quite easily.

The large time delays of the large output devices required for the high currents in traditional amplifiers, and the delays present in the multiple input stages of the amplifier, can also produce noticeable overshoot and input stage overload, especially at high currents and high frequencies. This performance is needed in low distortion amplification of audio recording signals, and also for other applications requiring low signal distortion by amplifiers.

In view of the foregoing, what is needed is an improved method and circuit to provide the lowest distortion achievable by an amplifier and create high voltages to drive electrostatic speakers or other loads, without the limitations of using large output transformers driving highly capacitive transducer loads.

SUMMARY OF THE INVENTION

The present invention can be implemented in numerous ways, such as by a method, a circuit, or an amplifier system. Four aspects of the invention are described below.

A first aspect of the invention is directed to a method to produce a differential bipolar output signal from a circuit. The method includes coupling an input signal to a circuit to produce an output, wherein the circuit includes one or more floating differential amplifier modules coupled together to produce the output, wherein the plurality of floating differential amplifier modules are coupled in series to create a high voltage differential amplifier and wherein at least one mismatch error of the plurality of floating differential amplifier modules becomes a power supply ripple which is substantially rejected by at least one amplifier of the circuit.

A second aspect of the invention is directed to a circuit to produce a differential bipolar output signal. The circuit includes a circuit to produce an output from an input signal, wherein the circuit includes a plurality of floating differential amplifier modules coupled together to produce the output, wherein the plurality of floating differential amplifier modules are coupled in series to create a high voltage differential amplifier and wherein at least one current mismatch error of the plurality of floating differential amplifier modules becomes a power supply ripple which is substantially rejected by at least one amplifier of the circuit.

These and other objects and advantages of the invention will become apparent to those skilled in the art from the following detailed description of the invention and the accompanying drawings.

DETAILED DESCRIPTION OF THE PREFERRED EMBODIMENT

Figure 1:
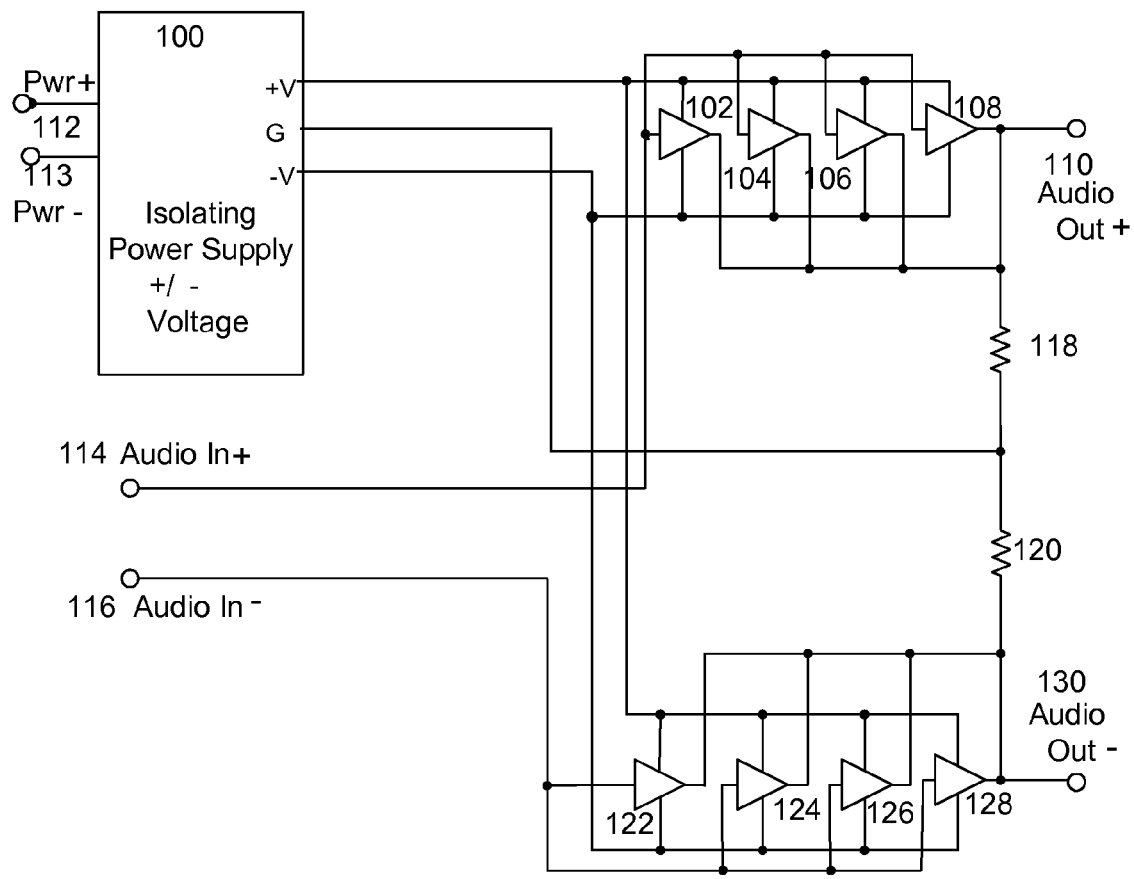
FIG. 1 illustrates differential amplifiers constructed with high performance buffers wired in parallel in a differential amplifier configuration which can produce excellent amplifier performance.

The invention provides a method, an apparatus, and a system to obtain low distortion amplification of signals (e.g., audio-frequency signals, higher frequencies, or equivalent signals requiring low distortion amplification. Various embodiments of the invention can be applied to audio applications, biological applications, medical applications, electronic applications, power generating applications, and any other applications where low distortion amplification can be beneficially used and needed for driving normal and capacitive loads. In this specification, drawings, and claims, any instance of the term audio-frequency is defined as any signal frequency in the frequency range of 15 to 500,000 cycles per second (Hertz).

Other terms used below are defined as follows. Unipolar amplifier—An amplifier that has a single power supply, where the amplifier has a single output that is offset from the power supply rails. This output typically needs a blocking capacitor to provide an unbiased output with respect to a power supply reference. Bipolar amplifier—An amplifier that has the equivalent of two power supplies, one positive and one negative with respect to a reference point. This layout allows for a single output with no DC bias with respect to the power supply reference. Differential amplifier—An amplifier which has two inputs and two outputs, one output goes positive with a positive voltage on the positive input and one output which goes the negative direction when a complimentary negative voltage is applied to the negative input. When this amplifier is floating, the two output amplifiers can be either unipolar or bipolar, since they do not require a power supply reference to provide output power.

In one embodiment of the invention, a bipolar amplifier can stand-alone and be combined with another bipolar amplifier to produce a differential output amplifier. Therefore, the modular approach starts with a single bipolar amplifier and can be expanded to paralleled and/or serialized segmented differential amplifiers with floating power supplies. This allows building floating bipolar amplifiers in various embodiments of the invention. Many times the power supplies of two bipolar amplifiers can be shared. This is generally true when using them to build a differential amplifier.

Solid-state amplifiers have not been used regularly for direct high voltage drive of electrostatic loudspeakers. The drive voltages necessary for electrostatic speakers are generally around 2000 $V_{RMS}$. Solid-state devices, such as transistors and MOSFETs, normally will withstand a maximum of 1000 $V_{DC}$. These groups of modules can be wired in series, and parallel, to provide arbitrary voltage and current performance to match any impedance and drive needs with lower voltage and lower current devices in alternative embodiments.

Traditional loudspeaker applications can benefit from this approach. Amplifiers can have arbitrary drive characteristics. In particular, a stereo amplifier with two channels using output modules similar to those in the above example, with correct switching can couple the various output modules in series or parallel. As a result, the same amplifier can be a stereo amplifier, a mono high current amplifier for lower impedances, or a mono high voltage amplifier for high impedance loads. This same function can be extended with several amplifier embodiments. This allows a truly universal amplifier module, which can be used in almost any application, with a sufficient number of modules utilized.

These amplifier modules can be considered an output stage. This output stage contains the output modules, which are driven by analog signals.

An analog input stage can be implemented using a very high performance gain-stage amplifier, a unity-gain buffer stage, a step-up transformer, or any combination of these. In any case it must properly drive the output modules of the design.

Floating differential amplifiers wired in series and parallel can be used to provide arbitrary drive capabilities for output voltages and output currents, while utilizing lower voltage and current devices. In addition these lower voltage and current devices can have better performance parameters compared to larger high power devices. In particular the use of large numbers of relatively small geometry devices can provide very high gain, high bandwidth, high linearity drive currents, and relatively better device protection from excess voltage and/or excess current induced secondary breakdown of the devices.

Several techniques are described that simplify the design and implementation of circuits using these types of devices. In particular they allow the design of amplifiers that use fewer of these output devices with little degradation of the performance of the amplifiers. In some applications and embodiments, the parameter performance of the devices improves with these techniques.

Technology

Previous patents by the same inventor, U.S. Pat. No. 7,365,605, and soon to be issued U.S. Pat. No. 7,449,946, both entitled "High Voltage, High Current, and High Accuracy Amplifier", which are both hereby included by reference, disclosed embodiments of high performance amplifiers using floating differential amplifiers wired in series and/or in parallel to provide selected power levels to arbitrary load impedances. This application discloses inventions that—(1) Use multiple differential amplifiers wired in series to generate a high voltage differential amplifier, while only partially using no-feedback buffer amplifiers and obtaining performance equivalent to an implementation that uses only buffer amplifiers. This is achieved by forcing the errors of the traditional amplifiers to become power supply ripple, which is highly rejected by the non-inverting buffer output stages. (2) Use a power supply centering technique to implement a floating asymmetrical differential amplifier. (3) Use multiple floating differential amplifiers, sharing a common power supply with individual biasing of each section of the amplifier, to allow high power amplifiers to be built with an arbitrary number of low power modules.

FIG. 1 illustrates differential amplifiers constructed with high performance buffers wired in parallel in a differential amplifier configuration that can produce excellent amplifier performance. This configuration uses an isolating power supply 100 with little coupling between the input and output voltages. The positive and negative power signals 112 are connected to the isolating power supply 100, and the positive audio in signal 114, and the negative audio in signal 116 provide the inputs, respectively, to two groups of non-inverting unity gain buffers 102, 104, 106, and 108 and 122, 124, 126, and 128 produce two independent amplifying channels (110 and 130, respectively), separated by resistors 118 and 120 for each of the input/output polarities. In one embodiment, these buffer amplifiers are unity gain and have no negative feedback.

Figure 2:
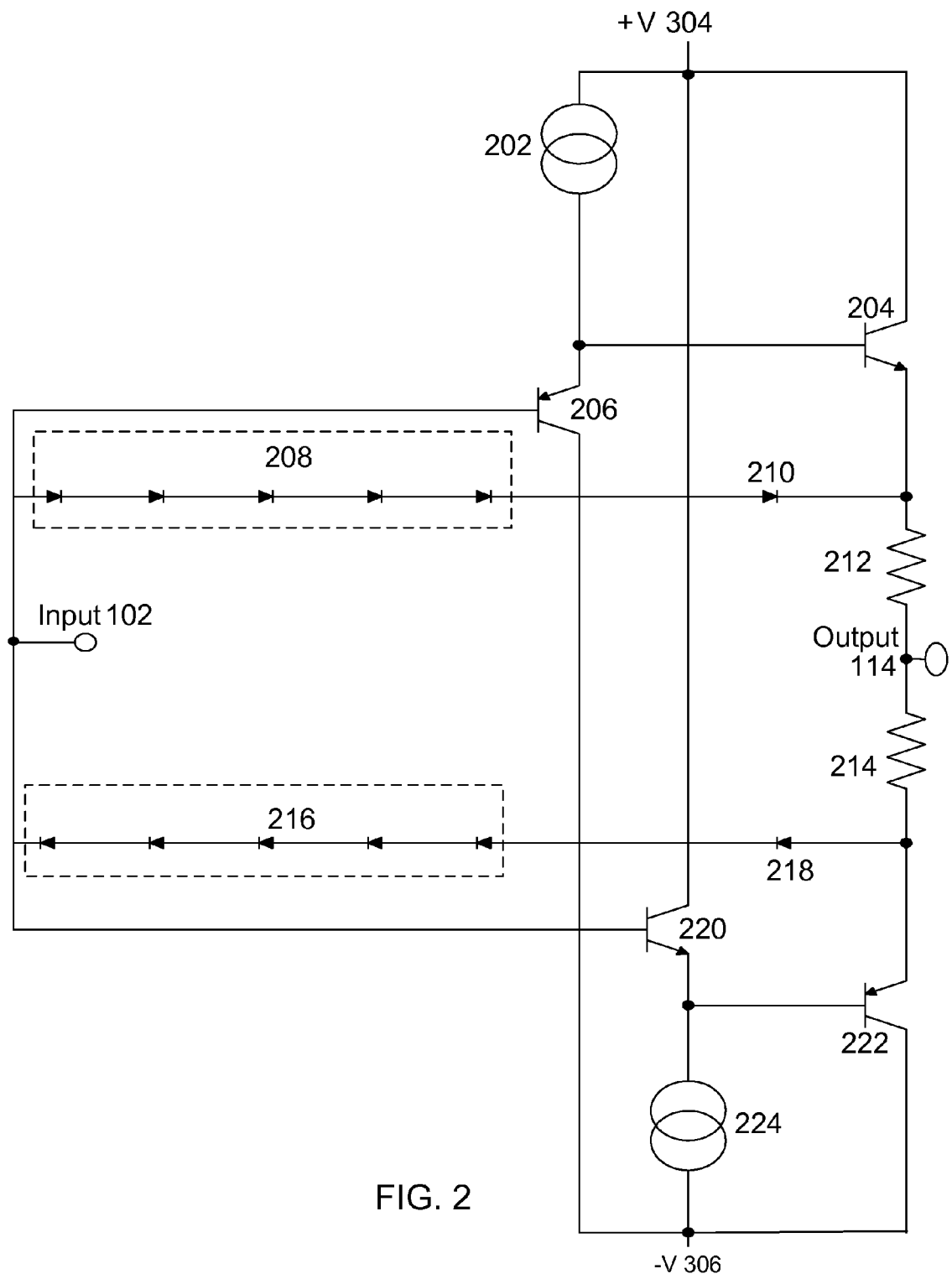
FIG. 2 illustrates a buffer amplifier for the output drive stage that contain two matched complimentary pairs of emitter followers to provide a high performance, no voltage gain, current amplifier.

FIG. 2 illustrates a typical implementation of one of these buffer amplifiers, such as the TI BUF634 (commercially available from Texas Instruments, with corporate headquarters in Dallas, Tex.) or an equivalent buffer. FIG. 2 illustrates a buffer amplifier for the output drive stage that contain two complimentary pairs of emitter followers to provide a high performance, no voltage gain, current amplifier. Positive polarity input signal 114 is an input to the bases of bipolar transistors 206 and 220. A positive voltage supply 304 and a negative polarity supply 306 energize the amplifier circuit including current sources 202 and 224; bipolar transistors 204, 206, 220; resistors 212 and 214; and diode groups 208, 216, and diodes 210 and 218; which in turn provide output signal 110 through series resistors 212 and 214, which are connected to the emitter outputs of the output transistors 204 and 222 for linearization and output current limiting. These current limit resistors 212 and 214 protect the amplifiers, but prevent the high damping factors (low output impedance) needed for high fidelity operation. The transistors in this amplifier are typically low power and high performance. Multiple of these amplifiers can be wired in parallel without problems. But it should be noted that connecting more of these devices in parallel can increase the output drive current, but the output drive voltage will not be increased.

Figure 3:
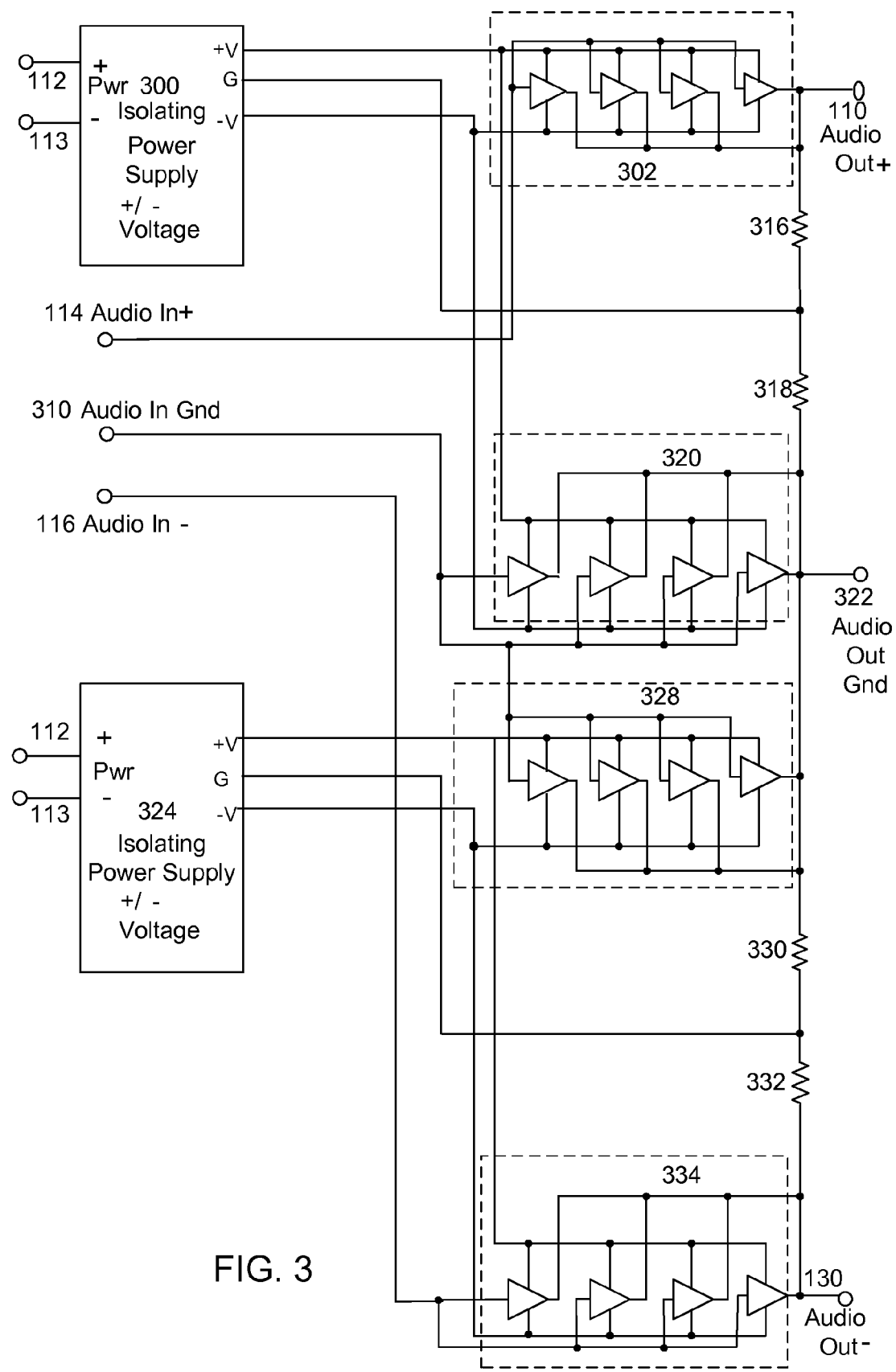
FIG. 3 illustrates a connection of two differential amplifiers with a differential amplifier configuration that will produce twice the output voltage swing of a single differential amplifier.

FIG. 3 illustrates a connection of two of these differential amplifiers with a differential amplifier configuration that will produce twice the output voltage swing of a single differential amplifier. Isolating power supply 300 receives positive power 112 and negative power 113 and produces positive and negative polarity power outputs connected to amplifier banks 302 and 320. Isolating power supply 324 receives positive power 112 and negative power 113 and produces positive and negative polarity power outputs connected to amplifier banks 328 and 334. This amplifier consists of two floating differential amplifiers wired in series. This is accomplished by wiring the negative buffer 320 output to the positive output buffer 328 of the lower floating amplifier. In addition, the inputs of these buffers are connected to each other and the Analog Input Ground 310. Current limiting resistors 316, 318, 330, and 332 provide voltage centering or biasing of the power supply neutral between the differential outputs of the amplifier module. Any number of floating differential amplifiers can be wired in series in this way to provide arbitrary drive capabilities for output voltages.

The Audio Out Ground 322 is the neutral voltage point which couples the drive current between the two differential amplifiers. This common voltage output point is not necessarily utilized as an output of the amplifier. It is used as a current transfer point and any voltage errors on this output do not necessarily couple to the differential outputs 110 and 130. Any irregularities appearing on this neutral point 322 will be partially coupled to the power supply. The buffer amplifiers 302 and 334 have a power supply rejection performance that will normally determine how much degradation will result from this. In most cases the degradation is negligible. As a result the buffers 320 and 328 connected to these common points can be higher distortion, higher power amplifiers. The resulting circuit is smaller and with less complexity and has lower cost than a group of parallel connected buffer amplifiers.

In some implementations of this amplifier configuration, the precision of this neutral output is important. In this case a particular circuit configuration can be used where the input and outputs of this amplifier 416 are tied together. In this configuration there is no possibility of voltage distortion, since the output is exactly the same voltage as the input. The amplifier circuits 416 and 422 then are not used and the bias current circuits 408 and 426 are all that are used to produce current sources to the other differential amplifiers. The power supply rejection ratio of the buffer amplifiers and the performance of the bias circuit give the degree of error injection to the drive signal in this mode of operation.

Figure 4:
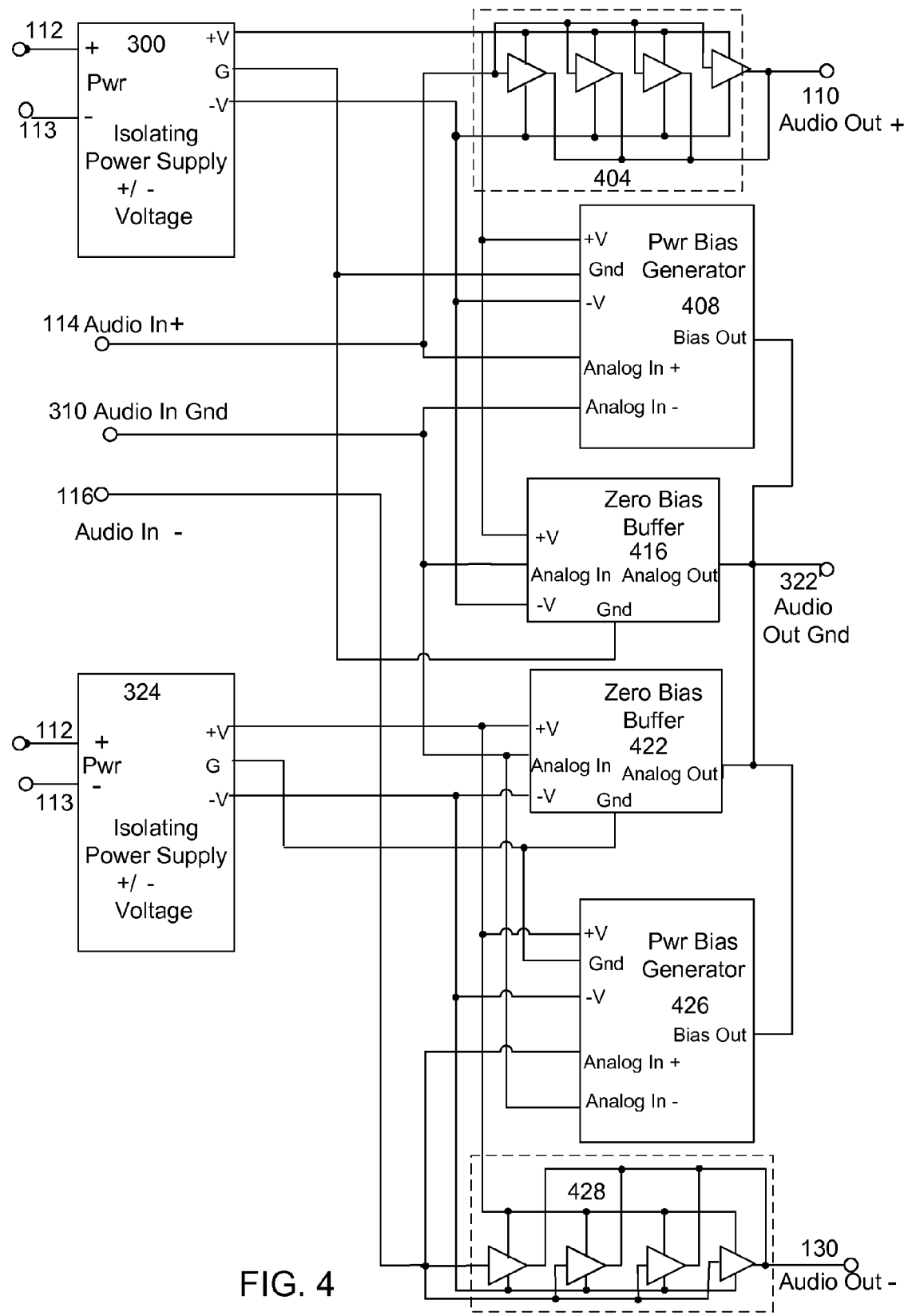
FIG. 4 illustrates an amplifier where the actual differential output signal is still provided by high performance buffer amplifiers, in accordance with one embodiment of the invention.

FIG. 4 illustrates an amplifier, according to one embodiment of the invention. The actual differential output signal is still provided by high performance buffer amplifiers. Isolating power supply 300 receives positive power 112 and negative power 113 and produces positive and negative polarity power outputs connected to amplifier banks 302 and 320. Isolating power supply 324 receives positive power 112 and negative power 113 and produces positive and negative polarity power outputs connected to amplifier banks 404 and 428, which are connected to the positive audio input 114 and the negative audio input 116. The power bias generators 408 and 426 also receive the positive polarity audio input 114, the negative polarity audio input 116, and the audio input ground 310. The audio input ground 310 is also connected to the negative polarity analog input of power bias generators 408 and 426, and also connected to the analog input of the zero bias buffers 416 and 422, which produce the audio output ground 322. The bias out signals from the bias generators 408 and 426 are also connected together to create an audio output ground 322. In another embodiment, for some applications, the zero bias amplifiers 416 and 422 are not necessary, in that their function can be replaced by the power bias generators (not shown). In addition, for another embodiment, if the differential amplifier module is a module which is only used to provide voltage and current biasing in a series of differential amplifier modules and not to provide amplifier output signals, the amplifier banks 404 and 428 can be replaced by zero biased amplifier modules (not shown).

When more than two balanced amplifier modules are wired in series a simple resistor divider can be used to equally space the common nodes connected between the modules. The modules, which have no actual output and are only used to bias other modules, can have two power output amplifier modules instead of only one and the parallel buffer amplifiers. Again the sum total of irregularities of these outputs will be removed by the power supply rejection of the buffer amplifiers that drive the actual outputs.

The power consumption and efficiency imbalances of the two sides (for example, modules 404 and 416) of the individual differential amplifiers need to be compensated for. With this compensation there will be equal loads on the positive and negative power supplies. Power bias generator 408 provides this function in the upper section of FIG. 4. There is no intrinsic input reference voltage, with a floating differential amplifier, that can be used for biasing the floating power supplies of the amplifier module. In one embodiment, if the output amplifiers are matched, then a simple resistor divider consisting of two resistors 118 and 120 (previously shown in FIG. 1) can be wired from each output to the common neutral point of the power supplies.

Figure 5:
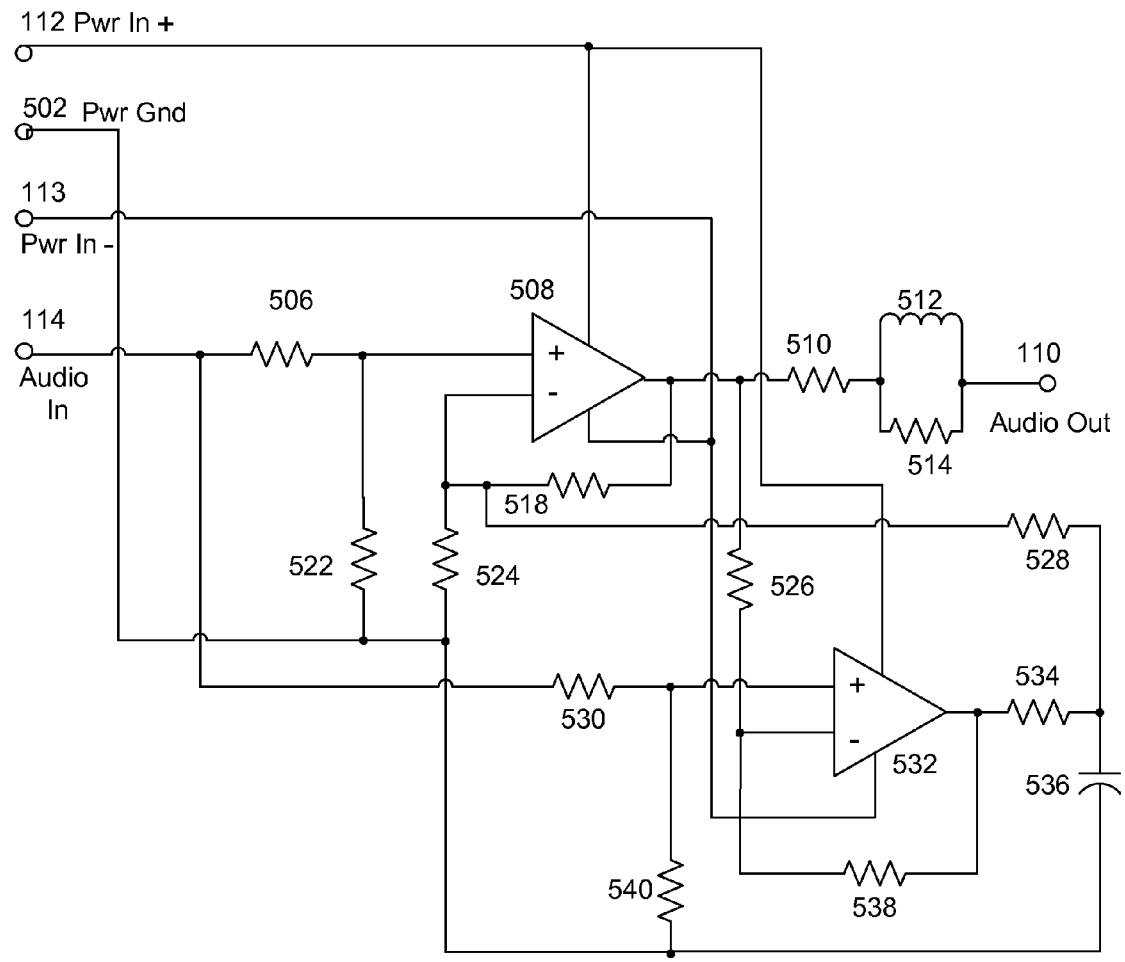
FIG. 5 illustrates a circuit, which performs current sourcing for either configuration of input/output wiring, in accordance with one embodiment of the invention.

FIG. 5 illustrates a circuit, which performs this current sourcing for either configuration of input/output wiring. This circuit includes positive polarity power 112, power ground 502, negative polarity power 114, audio input signal 114; resistors 506, 522, 518, 524, 530, 540, 510, 514, 526, 528, 538 and 534; inductor 512 and capacitor 536; and power operational amplifier 508 and operational amplifier 532 to produce audio output 110. This circuit uses power operational amplifier 508 wired so that it will be stable with any load. It also includes an input bias correction circuit built around operational amplifier 532 to remove any input offset or bias asymmetries to the input of the power amplifier. With this correction circuit it will appear that the power operational amplifier 508 has a perfect input with no bias offset characteristics. This is important when these amplifiers are wired in parallel.

The amplifier uses several techniques to create high stability. One of these is to use a resistor divider on the input with resistors 506 and 522 and feedback stage using resistor 518 and 524. These resistor dividers force the voltage gain of the amplifier to be 3, which is more stable. With these resistor dividers on the inputs, it is easy to use the capacitance between the inputs to help slow the amplifier down and stabilize it.

The output is wired through a series resistor 510 and a combination of a resistor 514 and inductor 512 wired in parallel. The first resistor provides a small load resister at all times and produces a voltage isolation for the input offset circuit to use to detect any input offset problems in amplifier 508. Without this resistor 510, it would be impossible to measure the output offset caused by input bias issues. In another embodiment of the invention, since some applications do not require the zero offset correction or the output currents produced by the input offset, they are not an issue and therefore the input offset correction is optionally absent.

The inductor 512 and resistor 514 wired in parallel provide high frequency isolation of the amplifier 508 with the output load coupled to audio output 110. With the resulting lighter load at high frequencies created by capacitive loading the amplifier is more stable. This effect also helps when driving highly capacitive loads as it restricts the current flows while a capacitor appears to be a short.

The bias circuit is composed of a high gain differential amplifier 532, with very low offset voltage. This can be the result of a low offset operational amplifier, or an offset trimming potentiometer. The inputs of this amplifier are wired through resistor 530 to the input of the power operational amplifier and through resistor 526 to its output. Resistor 540 scales the positive input and resistor 538 scales the output gain. If there is any voltage error between these two inputs it will be represented at the output of operational amplifier 532. After the output of operational amplifier 532 the following resistor 534 and capacitor 536 are used to provide a low pass filter for the output of operational amplifier 532. In audio applications the time constant of this filter should have an equivalent frequency much lower than 15 Hz. In one embodiment, a time constant of a second, or somewhat more than a second, would be suitable. The resistor 528 from the capacitor 536 to the negative input of the power operational amplifier 508 provides the input correction current needed for the amplifier 508.

Figure 6:
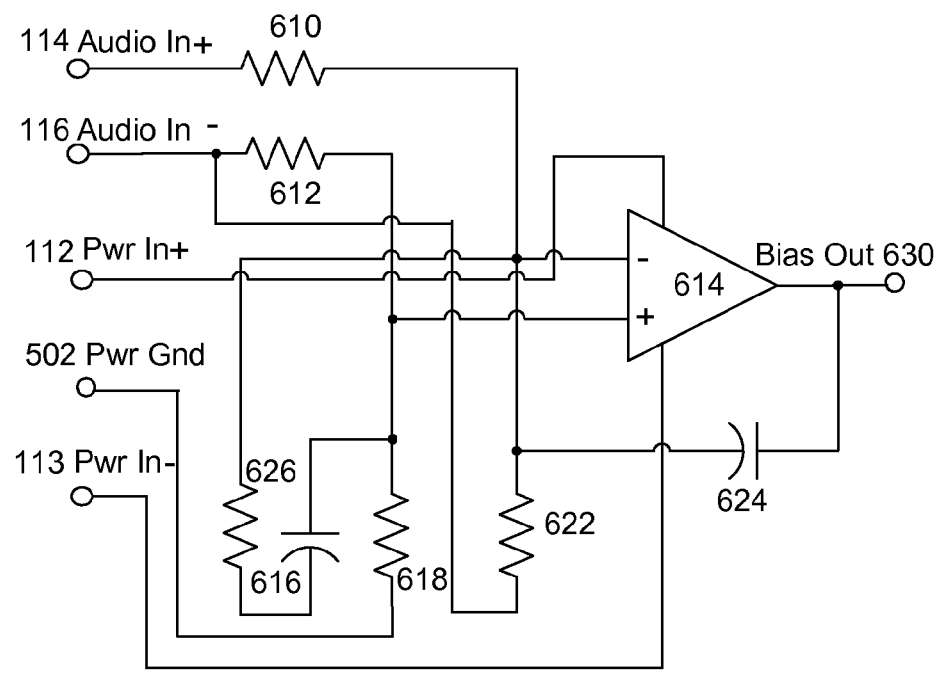
FIG. 6 illustrates a bias circuit, in accordance with one embodiment of the invention.

When the amplifiers are not matched, a special power supply bias circuit is needed. A circuit that performs this function was previously shown as module 408 in FIG. 4. FIG. 6 illustrates a bias circuit according to one embodiment of the invention. This bias circuit is used to center the neutral point of the supplies to a point half way between the inputs. This circuit pulls power from the appropriate power supply and passes it to the bias out signal 630. This bias out signal 630 is normally connected to the negative differential output of the differential amplifier module, thereby dynamically balancing the loading on the two supplies.

This circuit has a positive polarity audio input 114, a negative polarity audio input 116, a positive polarity power 112, a negative polarity power 113, and a power ground 502. This circuit simply consists of a power operational amplifier 614 wired with its output connected to the bias output signal 630. In this embodiment, each differential input is wired through a resistor divider, however another embodiment can use another circuit equivalent to resistor dividers. The positive operational amplifier input is referenced to power supply neutral using 4K ohms (1% tolerance) resistors 612 and 618. The source of the signal to 612 comes from the negative audio input. The negative input of the operational amplifier 614 is wired to 6K ohms (1% tolerance) 610 and 2K ohms (1% tolerance) 622. Resistor 610 is wired to the positive audio input 114 and resistor 622 is wired to the negative audio input 116. Two capacitors 616 and 624 and resistor 626 are used to stabilize the operational amplifier 614. It should be noted that the inputs of the operational amplifier 614 seem to be wired backwards. When the power supply neutral point is low with respect to the average of the audio inputs, the positive input to the operational amplifier 614 will be lower than the average of the positive and negative audio signals wired to the negative operational amplifier input. This indicates to the operational amplifier 614 that power needs to be supplied from the negative supply to the bias output 630. This means the supply neutral will be pushed higher by the operational amplifier 614 applying more negative drive to the negative audio output through the bias out connection to the negative audio output.

Figure 7:
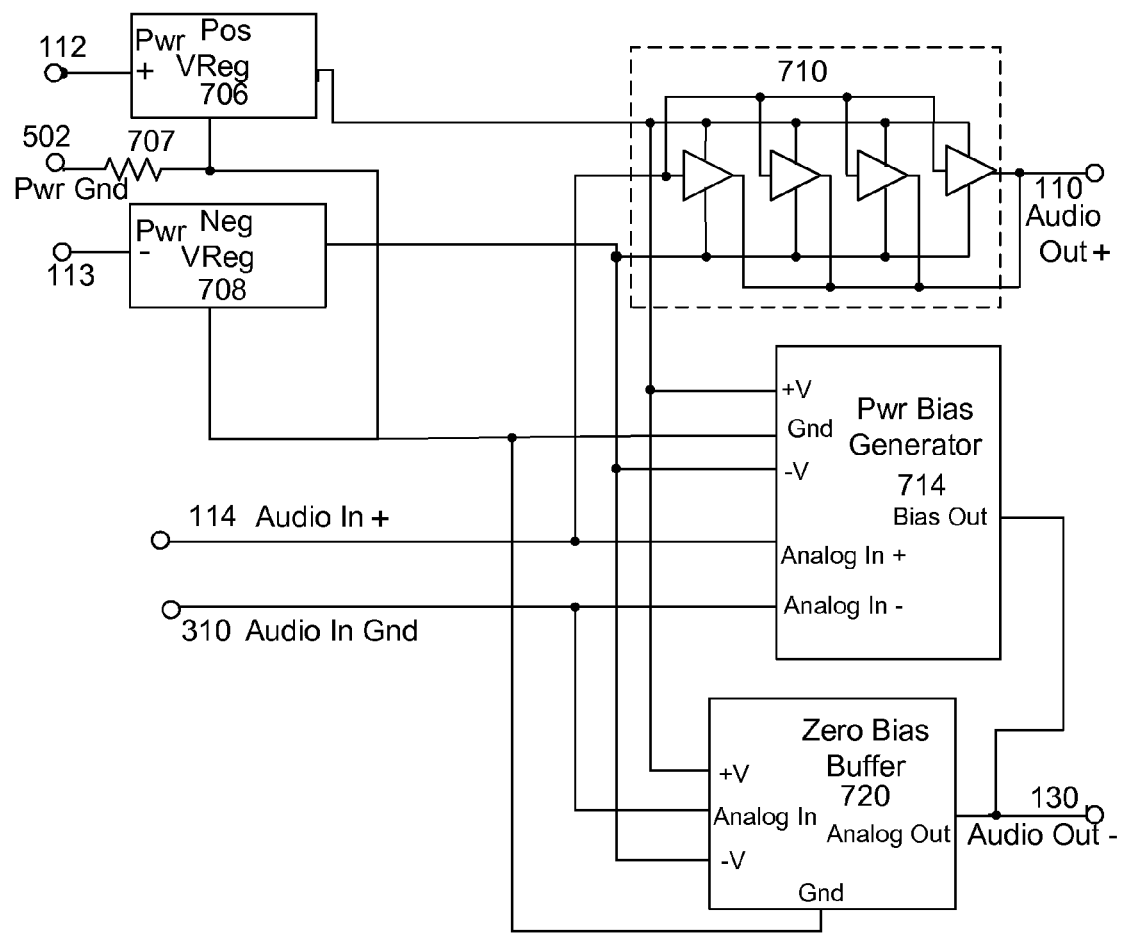
FIG. 7 illustrates floating differential amplifiers to provide separate power supply regulation for each small group of modules in an amplifier, in accordance with one embodiment of the invention.

An additional improvement to the design of a power amplifier using floating differential amplifiers would be to provide separate power supply regulation for each small group of modules in the amplifier. FIG. 7 illustrates a grouping of such modules, according to one embodiment of the invention. Positive polarity power 112 is coupled to the positive voltage regulator 706, and negative polarity power 113 is coupled to the negative voltage regulator 708. Power ground 502 is connected to resistor 707, which is connected to the grounds for power bias generator 714 and zero bias buffer 720. Positive and negative polarity power outputs are connected to amplifier bank 710. Positive audio input 114 and audio input ground 310 are inputs to power bias generator 714 and inputs to zero bias buffer 720. Zero bias buffer 720 produces negative audio output 130 and positive audio out 110 is produced by the amplifier bank 710.

As a consequence of the high compliance tracking characteristics of the voltage regulators inputs, each of these independent supplies can be individually centered by its own balancing circuit contained in module 714. With this approach the power supply components and the balancing circuit can be low enough power to allow it to be designed with inexpensive integrated devices even in a high power amplifier application. This design can scale to almost arbitrarily high current output levels.

Figure 8:
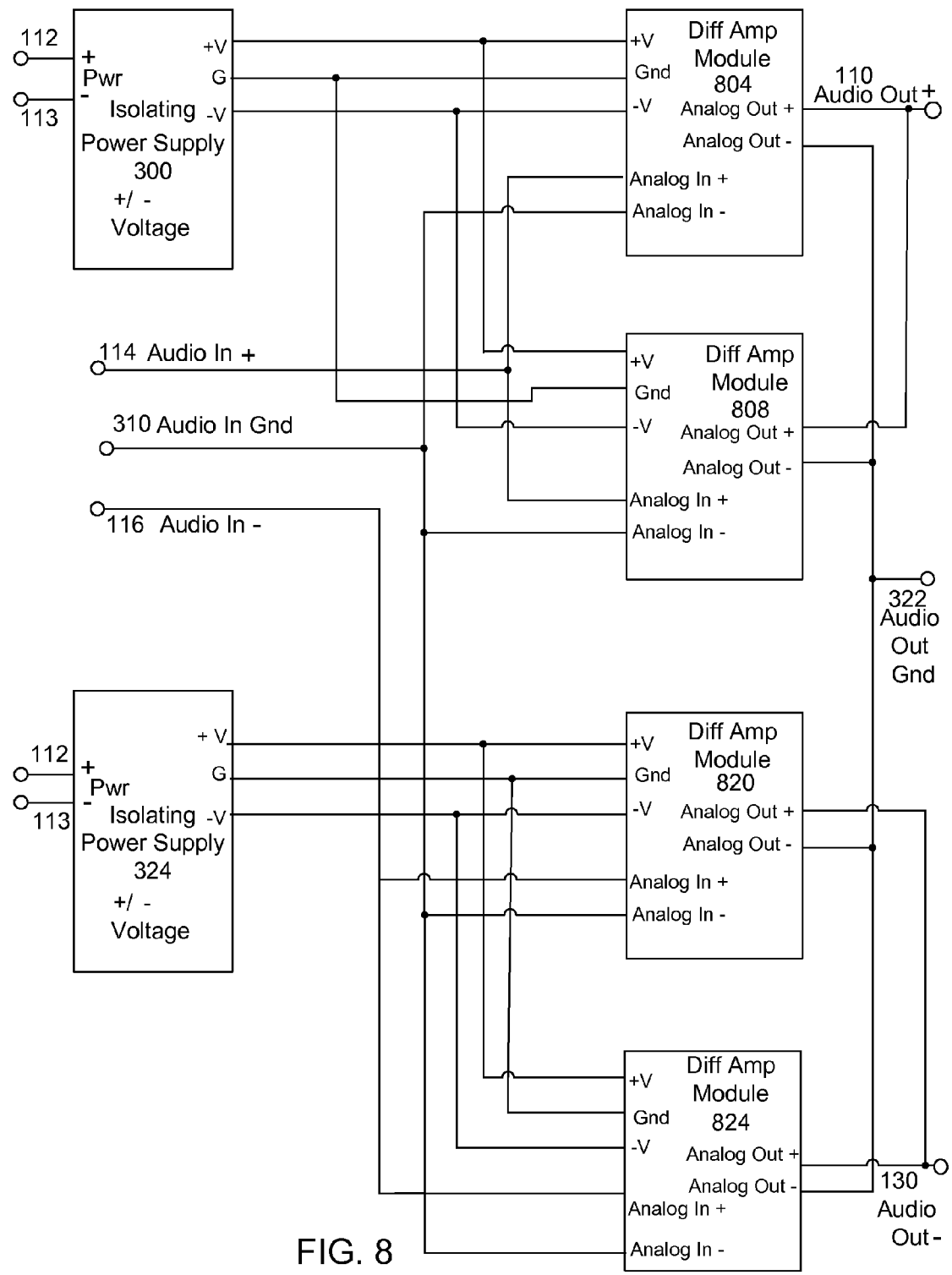
FIG. 8 illustrates an implementation of the full differential amplifier design, in accordance with one embodiment of the invention.

FIG. 8 illustrates an implementation of the full differential amplifier design, according to one embodiment of the invention. Isolating power supply 300 receives positive power 112 and negative power 113 and produces positive and negative polarity power outputs connected to differential amplifier modules 804 and 808. Isolating power supply 324 receives positive power 112 and negative power 113 and produces positive and negative polarity power outputs connected to differential amplifier modules 820 and 824. Positive audio output 110 is produced by differential amplifier module 804 and 808. Audio output ground 322 is produced by differential amplifier module 804 and 824. Positive audio output 110 is produced by differential amplifier module 804 and 808. Audio input ground 310 is connected to the negative analog inputs of differential amplifier modules 804, 808, 820, and 824. Positive audio input 114 is connected to the positive analog inputs of differential amplifier modules 804 and 808. Negative audio input 116 is connected to the positive analog inputs of differential amplifier modules 820 and 824 and the negative audio input 116. As disclosed previously, the zero bias amplifier 720 can be removed for some embodiments in some circumstances. In one embodiment, if the differential amplifier module is a module that is only used to provide voltage and current biasing in a series of differential amplifier modules, and not to provide amplifier output signals, the amplifier bank 710 is replaced by a zero bias amplifier module.

Figure 9:
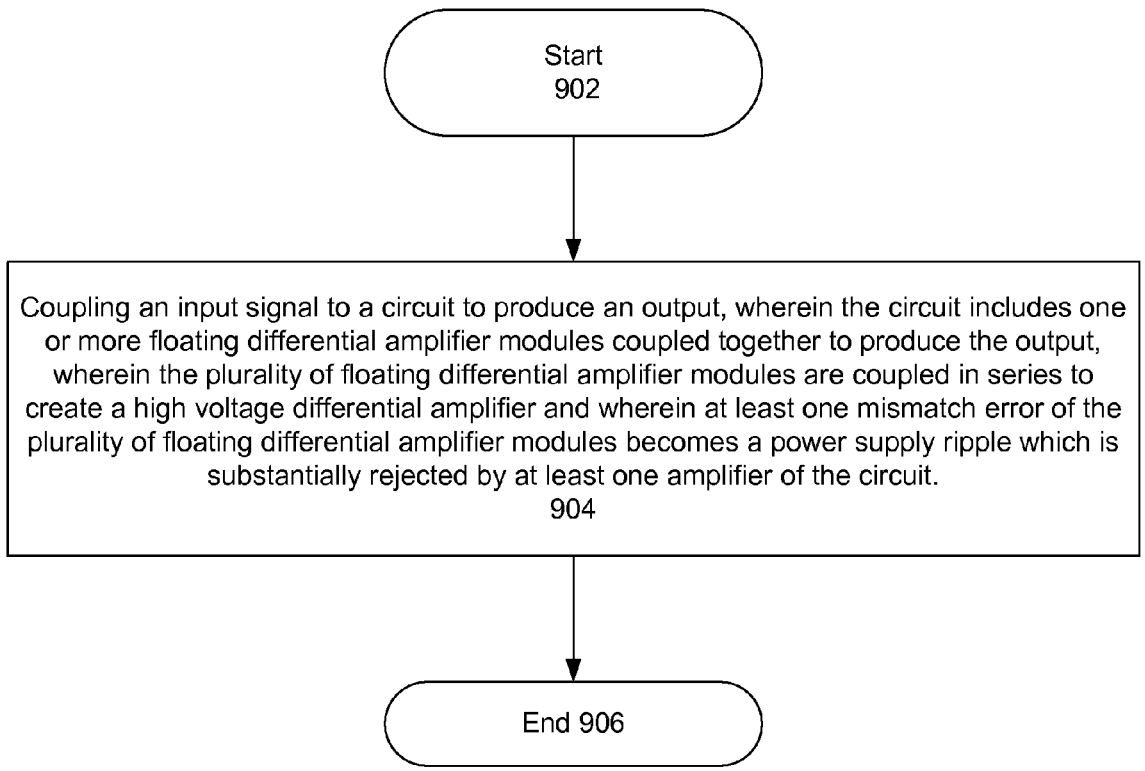
FIG. 9 illustrates a flowchart of a method to produce a bipolar differential output signal from a circuit, in accordance with one embodiment of the invention.

FIG. 9 illustrates a flowchart of a method to produce a differential bipolar output signal from a circuit, in accordance with one embodiment of the invention. The sequence starts in operation 902. Operation 904 includes coupling an input signal to a circuit to produce an output, wherein the circuit includes one or more floating differential amplifier modules coupled together to produce the output, wherein the plurality of floating differential amplifier modules are coupled in series to create a high voltage differential amplifier and wherein at least one mismatch error of the plurality of floating differential amplifier modules becomes a power supply ripple which is substantially rejected by at least one amplifier of the circuit. The method ends in operation 906.

Figure 10:
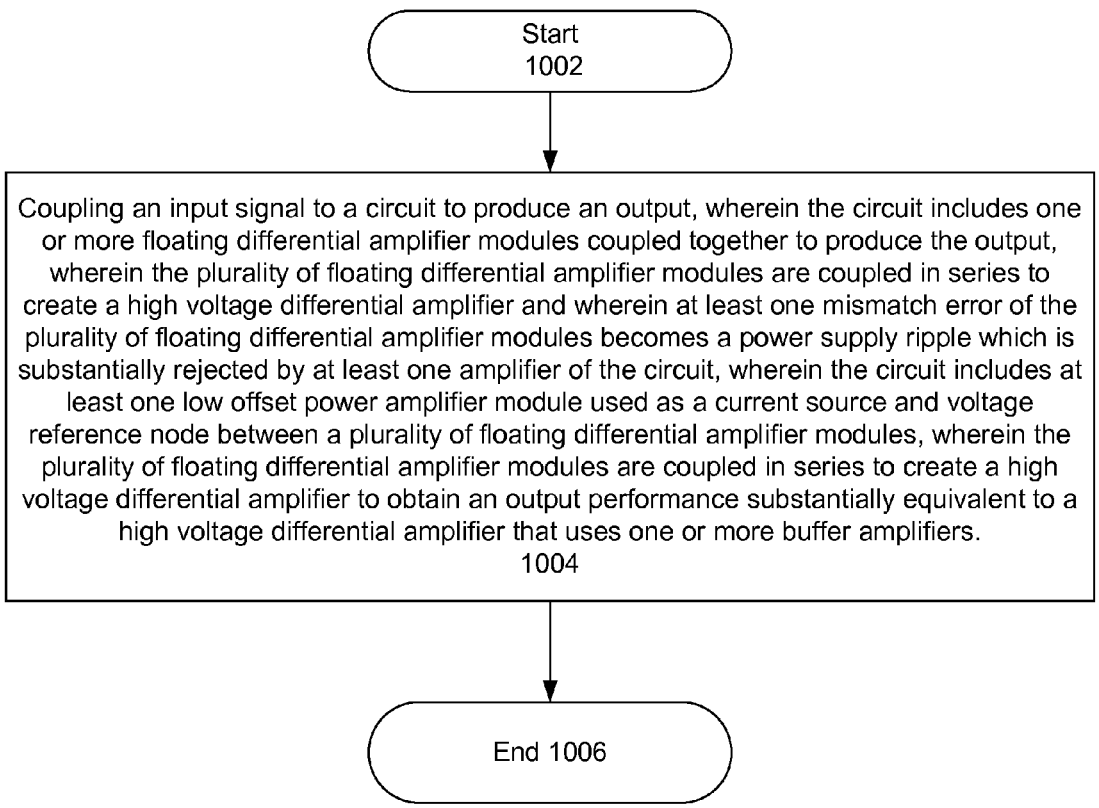
FIG. 10 illustrates a flowchart of a method to produce a bipolar differential output signal from a circuit, in accordance with one embodiment of the invention.

FIG. 10 illustrates a flowchart of a method to produce a differential bipolar output signal from a circuit, in accordance with one embodiment of the invention. The sequence starts in operation 1002. Operation 1004 includes coupling an input signal to a circuit to produce an output, wherein the circuit includes one or more floating differential amplifier modules coupled together to produce the output, wherein the plurality of floating differential amplifier modules are coupled in series to create a high voltage differential amplifier and wherein at least one mismatch error of the plurality of floating differential amplifier modules becomes a power supply ripple which is substantially rejected by at least one amplifier of the circuit, wherein the circuit includes at least one low offset power amplifier module used as a current and voltage source node between a plurality of floating differential amplifier modules, wherein the plurality of floating differential amplifier modules are coupled in series to create a high voltage differential amplifier to obtain an output performance substantially equivalent to a high voltage differential amplifier that uses one or more buffer amplifiers. The method ends in operation 1006.

Figure 11:
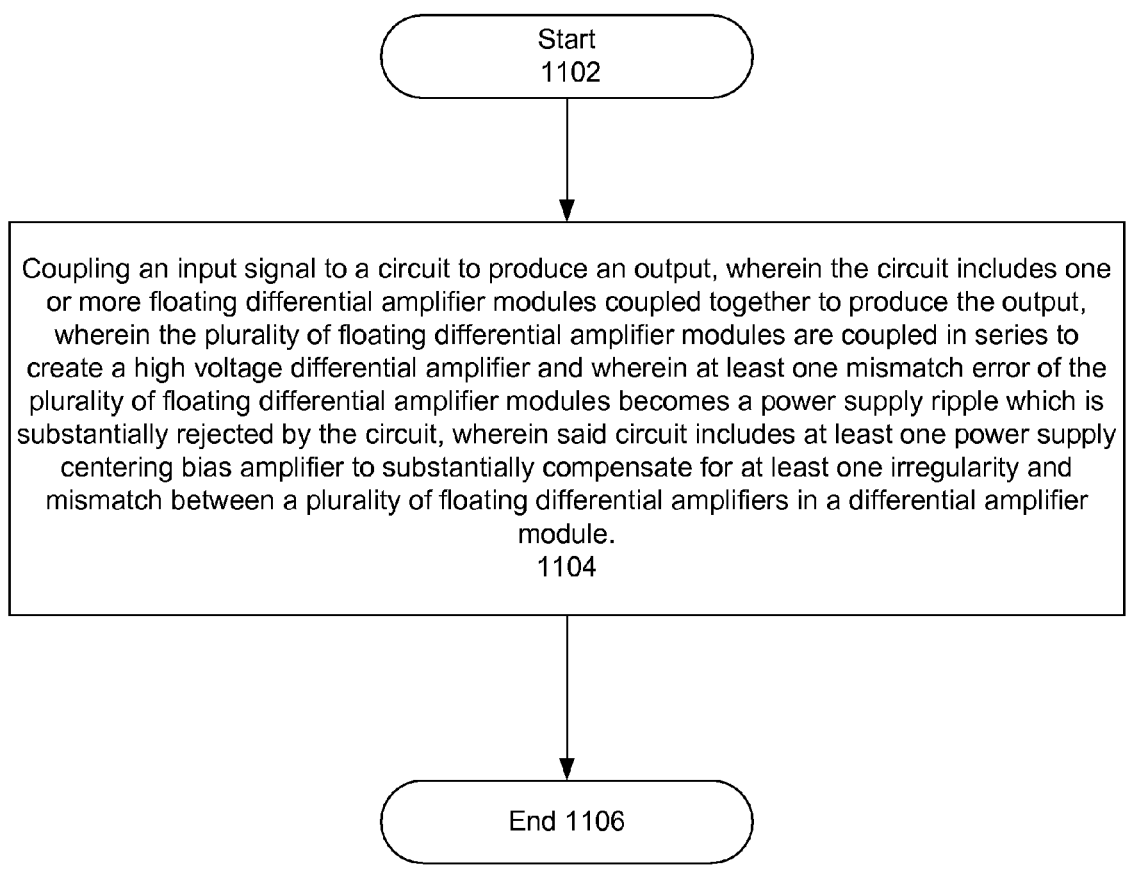
FIG. 11 illustrates a flowchart of a method to produce a bipolar differential output signal from a circuit, in accordance with one embodiment of the invention.

FIG. 11 illustrates a flowchart of a method to produce a differential bipolar output signal from a circuit, in accordance with one embodiment of the invention. The sequence starts in operation 1102. Operation 1104 includes coupling an input signal to a circuit to produce an output, wherein the circuit includes one or more floating differential amplifier modules coupled together to produce the output, wherein the plurality of floating differential amplifier modules are coupled in series to create a high voltage differential amplifier and wherein at least one mismatch error of the plurality of floating differential amplifier modules becomes a power supply ripple which is substantially rejected by the circuit, wherein said circuit includes at least one power supply centering bias amplifier to substantially compensate for at least one irregularity and mismatch between a plurality of floating differential amplifiers in a differential amplifier module. The method ends in operation 1106.

Figure 12:
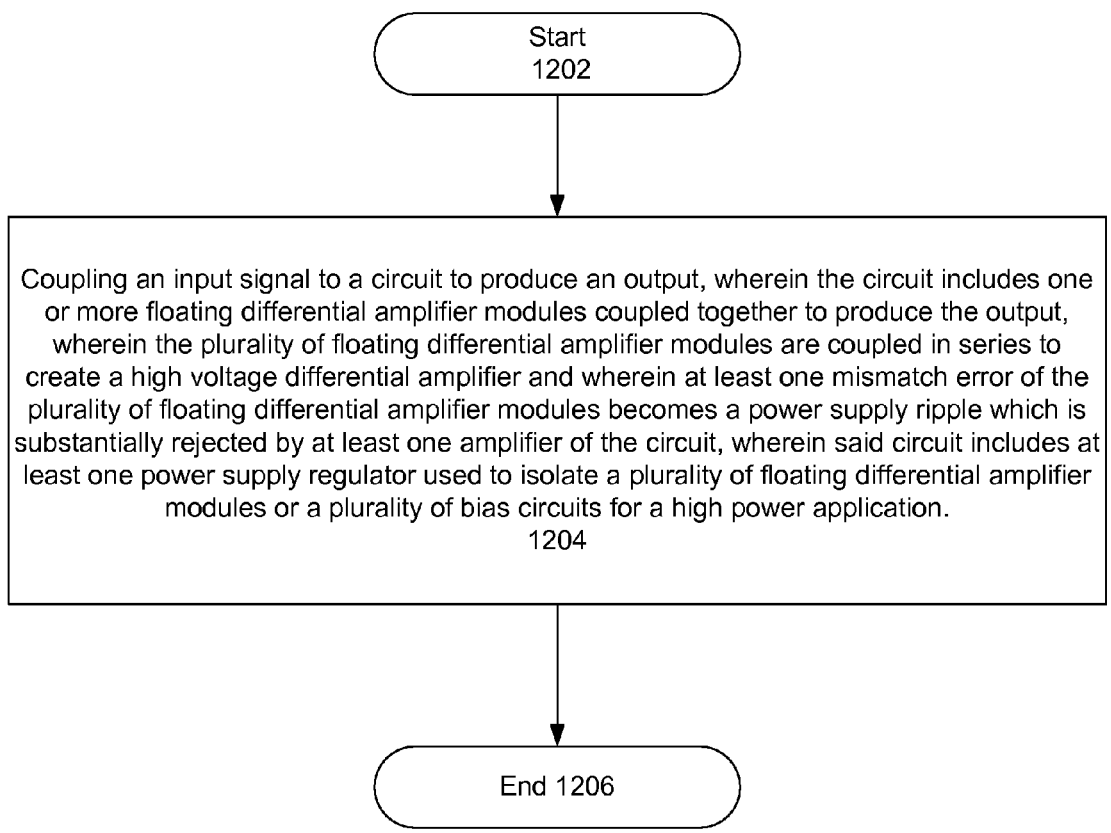
FIG. 12 illustrates a flowchart of a method to produce an bipolar differential output signal from a circuit, in accordance with one embodiment of the invention.

FIG. 12 illustrates a flowchart of a method to produce a differential bipolar output signal from a circuit, in accordance with one embodiment of the invention. The sequence starts in operation 1202. Operation 1204 includes coupling an input signal to a circuit to produce an output, wherein the circuit includes one or more floating differential amplifier modules coupled together to produce the output, wherein the plurality of floating differential amplifier modules are coupled in series to create a high voltage differential amplifier and wherein at least one mismatch error of the plurality of floating differential amplifier modules becomes a power supply ripple which is substantially rejected by at least one amplifier of the circuit, wherein said circuit includes at least one power supply regulator used to isolate a plurality of floating differential amplifier modules or a plurality of bias circuits for a high power application. The method ends in operation 1206.

In summary, one embodiment of the invention uses unity gain buffer amplifiers to construct differential amplifiers. These differential amplifiers can be wired in series to produce higher voltage amplification. In another embodiment of the invention, one or more differential amplifiers are constructed using low offset amplifiers and/or power supply biasing circuits to compliment unity gain buffer output stages. The use of unity-gain buffers improves the performance of the circuit, since the linearity is very high and the power supply rejection enables the use of low offset amplifiers and power supply bias generators to be used as replacements for unity gain amplifiers.

Several embodiments of the invention are possible. The phrase "in one embodiment" used in the specification can refer to a new embodiment, a different embodiment disclosed elsewhere in the application, or the same embodiment disclosed earlier in the application. The exemplary embodiments described herein are for purposes of illustration and are not intended to be limiting. Therefore, those skilled in the art will recognize that other embodiments could be practiced without departing from the scope and spirit of the claims set forth below.

What is claimed is:

1. A method to produce a differential bipolar output signal from a circuit, said method comprising:

coupling an input signal to a circuit to produce an output, wherein said circuit includes one or more floating differential amplifier modules coupled together to produce said output, wherein said plurality of floating differential amplifier modules are coupled in series to create a high voltage differential amplifier and wherein at least one mismatch error of said plurality of floating differential amplifier modules becomes a power supply ripple which is substantially rejected by at least one amplifier in said circuit.

2. The method of claim 1, wherein said output includes at least one audio-frequency signal.

3. The method of claim 1, wherein said circuit includes at least one operational amplifier.

4. The method of claim 1, wherein said circuit includes at least one low offset power amplifier module used as a current and voltage source node between a plurality of floating differential amplifier modules, wherein said plurality of floating differential amplifier modules are coupled in series to create a high voltage differential amplifier to obtain an output performance substantially equivalent to a high voltage differential amplifier that uses one or more buffer amplifiers.

5. The method of claim 1, wherein said circuit includes at least one low offset power amplifier module wired with an output of said low offset power amplifier module.

6. The method of claim 1, wherein said circuit includes at least one power supply centering bias amplifier to substantially compensate for at least one irregularity and mismatch between amplifiers in a differential amplifier module.

7. The method of claim 1, wherein said circuit includes at least one power supply regulator used to isolate a plurality of floating differential amplifier modules for selected high power applications.

8. The method of claim 1, wherein said circuit includes at least one power supply regulator used to isolate a plurality of bias circuits for selected high power applications.

9. The method of claim 1, wherein said circuit includes at least one group of operational amplifiers, wherein each said group of operational amplifiers includes at least one operational amplifier.

10. A circuit to produce a differential bipolar output signal, said circuit comprising:
a circuit to produce an output from an input signal, wherein said circuit includes a plurality of floating differential modules coupled together to produce said output, wherein said plurality of floating differential amplifier modules are coupled in series to create a high voltage differential amplifier and wherein at least one mismatch error of said plurality of floating differential amplifier modules becomes a power supply ripple which is substantially rejected by at least one amplifier in the circuit.

11. The circuit of claim 10, wherein said output includes at least one audio-frequency signal.

12. The circuit of claim 10, wherein said circuit includes at least one operational amplifier.

13. The circuit of claim 10, wherein said circuit includes at least one low offset power amplifier module used as a voltage and current source node between a plurality of floating differential amplifier modules, wherein said plurality of floating differential amplifier modules are coupled in series to create a high voltage differential amplifier.

14. The circuit of claim 10, wherein said circuit includes at least one output of power amplifier module coupled to an input of said power amplifier module, substantially eliminating the need for said power amplifier to provide a very low distortion output from a current node between a plurality of floating differential amplifier modules.

15. The circuit of claim 10, wherein said circuit includes at least one power supply centering bias amplifier to substantially compensate for at least one output irregularity and mismatch between amplifiers in a differential amplifier module.

16. The circuit of claim 10, wherein said circuit includes at least one power supply regulator used to isolate a plurality of floating differential amplifiers for selected high power applications.

17. The circuit of claim 10, wherein said circuit includes at least one power supply regulator used to isolate a plurality of buffer amplifiers for selected high power applications.

18. The circuit of claim 10, wherein said circuit includes at least one power supply regulator used to isolate a plurality of bias circuits for selected high power applications.

19. An amplifier to produce a differential bipolar output signal, said amplifier comprising:
a circuit to produce an output from an input signal, wherein said circuit includes one or more floating differential modules coupled together to produce said output, wherein said plurality of floating differential modules are coupled in series to create a high voltage differential amplifier, wherein said circuit includes at least one low offset power amplifier module used as a voltage and current source node between a plurality of floating differential amplifier modules, and wherein at least one mismatch of said plurality of floating differential modules becomes a power supply ripple which is substantially rejected by at least one amplifier in the circuit.

20. The amplifier of claim 19, wherein said circuit includes at least one power supply centering bias amplifier to substantially compensate for at least one irregularity and mismatch between a plurality of amplifiers in a differential amplifier module.

\* \* \* \* \*